US012644184B2

(12) United States Patent
Baluja et al.

(10) Patent No.: US 12,644,184 B2
(45) Date of Patent: Jun. 2, 2026

(54) TUNABLE HARDWARE TO CONTROL RADIAL FLOW DISTRIBUTION IN A PROCESSING CHAMBER

(71) Applicant: Applied Materials, Inc., Santa Clara, CA (US)

(72) Inventors: Sanjeev Baluja, Campbell, CA (US); Muhannad Mustafa, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 32 days.

(21) Appl. No.: 18/540,311

(22) Filed: Dec. 14, 2023

(65) Prior Publication Data

US 2024/0209506 A1 Jun. 27, 2024

Related U.S. Application Data

(60) Provisional application No. 63/434,316, filed on Dec. 21, 2022.

(51) Int. Cl.
 *C23C 16/455* (2006.01)
 *C23C 16/52* (2006.01)
(52) U.S. Cl.
 CPC ........ *C23C 16/45589* (2013.01); *C23C 16/52* (2013.01)
(58) Field of Classification Search
 None
 See application file for complete search history.

(56) References Cited

U.S. PATENT DOCUMENTS

| | | | | |
|---|---|---|---|---|
| 5,186,756 A * | 2/1993 | Benko | ..................... | C30B 25/14 |
| | | | | 118/725 |
| 2004/0082251 A1* | 4/2004 | Bach | ................... | H01J 37/3244 |
| | | | | 445/60 |
| 2006/0263522 A1* | 11/2006 | Byun | ................ | C23C 16/45519 |
| | | | | 427/248.1 |
| 2009/0095218 A1* | 4/2009 | Meinhold | ......... | C23C 16/45565 |
| | | | | 118/712 |
| 2010/0112212 A1* | 5/2010 | Zhang | ................. | H01J 37/3244 |
| | | | | 118/723 R |
| 2010/0311249 A1* | 12/2010 | White | ................. | H01J 37/3244 |
| | | | | 427/523 |
| 2011/0146571 A1* | 6/2011 | Bartlett | ............... | C23C 16/4401 |
| | | | | 118/667 |

* cited by examiner

*Primary Examiner* — Jeffrie R Lund
*Assistant Examiner* — Tiffany Z Nuckols
(74) *Attorney, Agent, or Firm* — Servilla Whitney LLC

(57) ABSTRACT

Gas distribution assemblies comprising a backing plate, a first enclosure with an outer diameter smaller than an outer diameter of an opening in the center of the backing plate. A top plate is connected to the top of the first enclosure. A compressible seal surrounds the first enclosure connecting the top plate to the backing plate outside the opening in the backing plate. An actuator is connected to the backing plate and the top plate to move the top plate closer to and further from the backing plate. A plunger extends through the opening in the center of the first enclosure. Methods of controlling a flow profile are also disclosed.

20 Claims, 10 Drawing Sheets

First Position

Third Position

Second Position

-150 mm                    0                    150 mm

TUNABLE HARDWARE TO CONTROL RADIAL FLOW DISTRIBUTION IN A PROCESSING CHAMBER

CROSS-REFERENCE TO RELATED APPLICATIONS

This application claims priority to U.S. Provisional Application No. 63/434,316, filed Dec. 21, 2022, the entire disclosure of which is hereby incorporated by reference herein.

TECHNICAL FIELD

Embodiments of the disclosure generally relate to apparatus and methods for controlling gas flow in a processing chamber. In particular, embodiments of the disclosure relate to apparatus and methods for controlling the radial flow profile in a processing chamber using a tunable hardware configuration.

BACKGROUND

During semiconductor manufacturing, a substrate is subjected to many different processes that incorporate a gas flow across the substrate surface. For example, deposition, etching, cleaning, and film treatment processes. Current processing chamber hardware often exhibit on-wafer non-uniformity as a result of non-uniform gas exposure. For example, the flow rate of a gas at the center of the substrate may be different than the flow rate at the out peripheral edge of the substrate, creating a radial on-wafer non-uniformity in the quality of devices being manufactured.

Accordingly, there is an ongoing need in the art for apparatus and methods to improve on-wafer uniformity.

SUMMARY OF THE CLAIMS

One or more embodiments of the disclosure are directed to gas distribution assemblies comprising: a backing plate having an opening in a center thereof; a first enclosure having an inner diameter and outer diameter defining a wall thickness, a top having an opening in a center thereof and an open bottom with a bottom face configured to allow a reactant to exit therethrough, the outer diameter of the first enclosure being smaller than an outer diameter of the opening in the center of the backing plate; a top plate connected to the top of the first enclosure; a compressible seal surrounding the first enclosure connecting the top plate to the backing plate outside the opening in the backing plate, the compressible seal allows movement of the top plate and prevent gas from leaking from inside the first enclosure to outside the compressible seal; an actuator connected to the backing plate and the top plate, the actuator configured to move the top plate closer to and further from the backing plate; and a plunger extending through the opening in the center of the first enclosure, the plunger having a plunger top with a plunger top bottom face and a plunger body having an outer diameter, the plunger has a length extending from a plunger top bottom face to a plunger body bottom face.

Additional embodiments of the disclosure are directed to gas distribution assemblies comprising: a backing plate having an opening in a center thereof with an outer diameter, the backing plate having a front surface and a back surface; a faceplate attached to the backing plate, the faceplate having a back surface spaced a distance from the front surface of the backing plate to form a plenum; a first enclosure having an inner diameter and outer diameter defining a wall thickness, a top having an opening in a center thereof and an open bottom with a bottom face configured to allow a reactant to exit therethrough, the outer diameter of the first enclosure being in the range of 1 mm to 5 mm smaller than the outer diameter of the opening in the center of the backing plate; a top plate connected to the top of the first enclosure, the top plate having an opening aligned with the opening in the top of the first enclosure, the top plate having a top surface and a bottom surface; a compressible seal surrounding the first enclosure connecting the top plate to the backing plate outside the opening in the backing plate, the compressible seal allowing movement of the top plate closer to and further from the back surface of the backing plate and configured to prevent gas from leaking from inside the first enclosure to outside the compressible seal; an actuator connected to the backing plate and the top plate, the actuator configured to move the top plate closer to and further from the back surface of the backing plate; a plunger extending through the opening in the center of the first enclosure, the plunger having a plunger top with a plurality of apertures extending therethrough, the plunger top having a plunger top bottom face in contact with the bottom surface of the top plate, the plunger including a plunger body having an outer diameter, the plunger has a length extending from the bottom face of the plunger top to a bottom face of the plunger body, the length of the plunger sufficient to allow the plunger body bottom face to extend beyond the bottom face of the first enclosure by a distance in the range of 2-3 mm; and a distance sensor configured to measure a distance between the top plate and the backing plate.

Further embodiments of the disclosure are directed to methods of controlling a flow profile in a gas distribution assembly, the method comprising moving a first enclosure within an opening in a backing plate to extend a distance into a plenum formed between a bottom surface of the backing plate and a top surface of a faceplate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon Embodiments of the disclosure advantageously provide tunable hardware to control the radial flow distribution of a gas across the substrate surface. Some embodiments allow for the optimization of on-wafer uniformity for a wider process regime window on a single processing chamber. Some embodiments provide hardware that improves chamber matching. Some embodiments allow for the fine tuning of process non-uniformity for better on-wafer results. Embodiments of the disclosure provide a movable plunger that changes center to edge pressure distribution above the showerhead to tune the radial gas flow.

Figure 1:
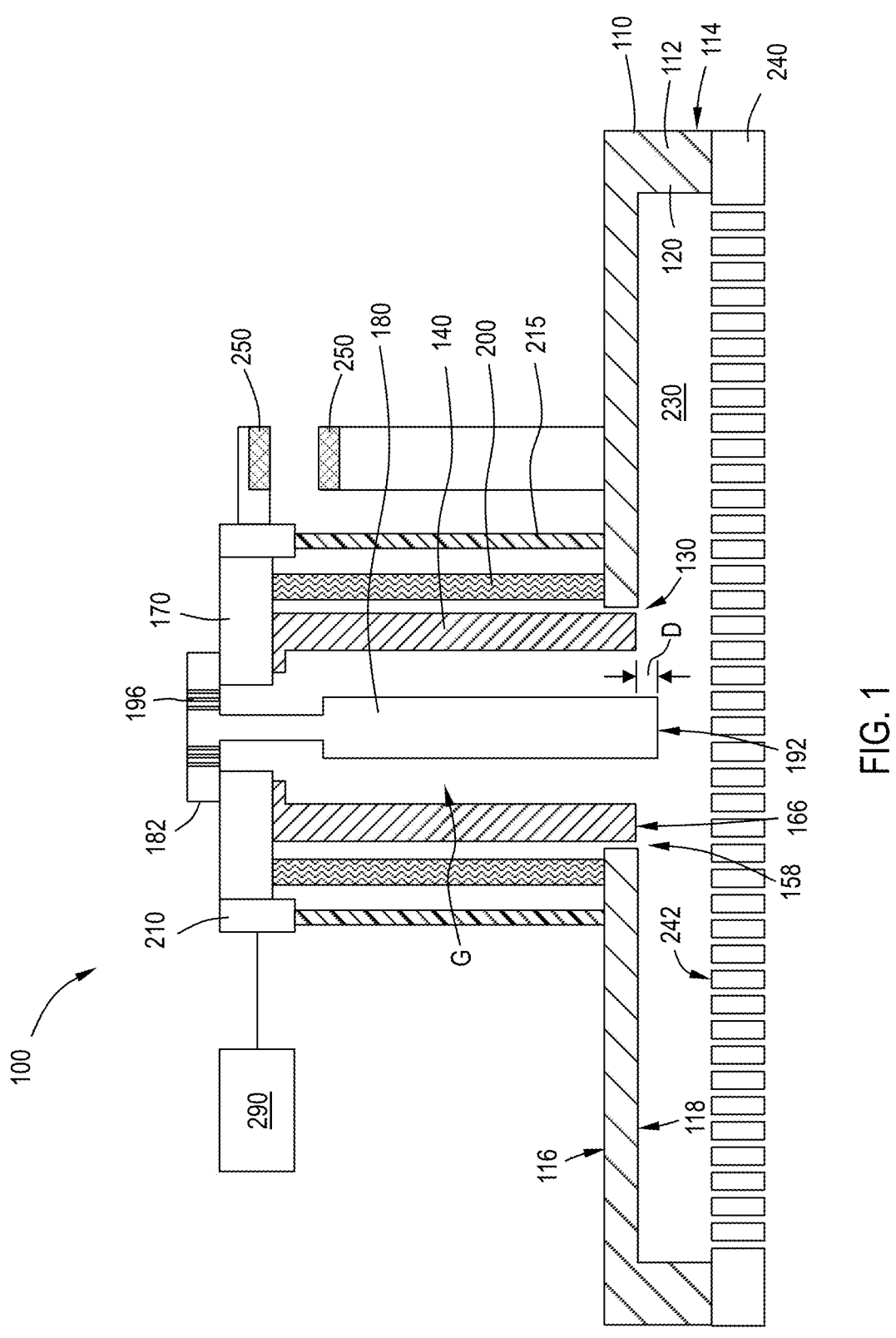
FIG. 1 illustrates a cross-sectional schematic view of a gas distribution assembly according to one or more embodiments of the disclosure.
Figure 2:
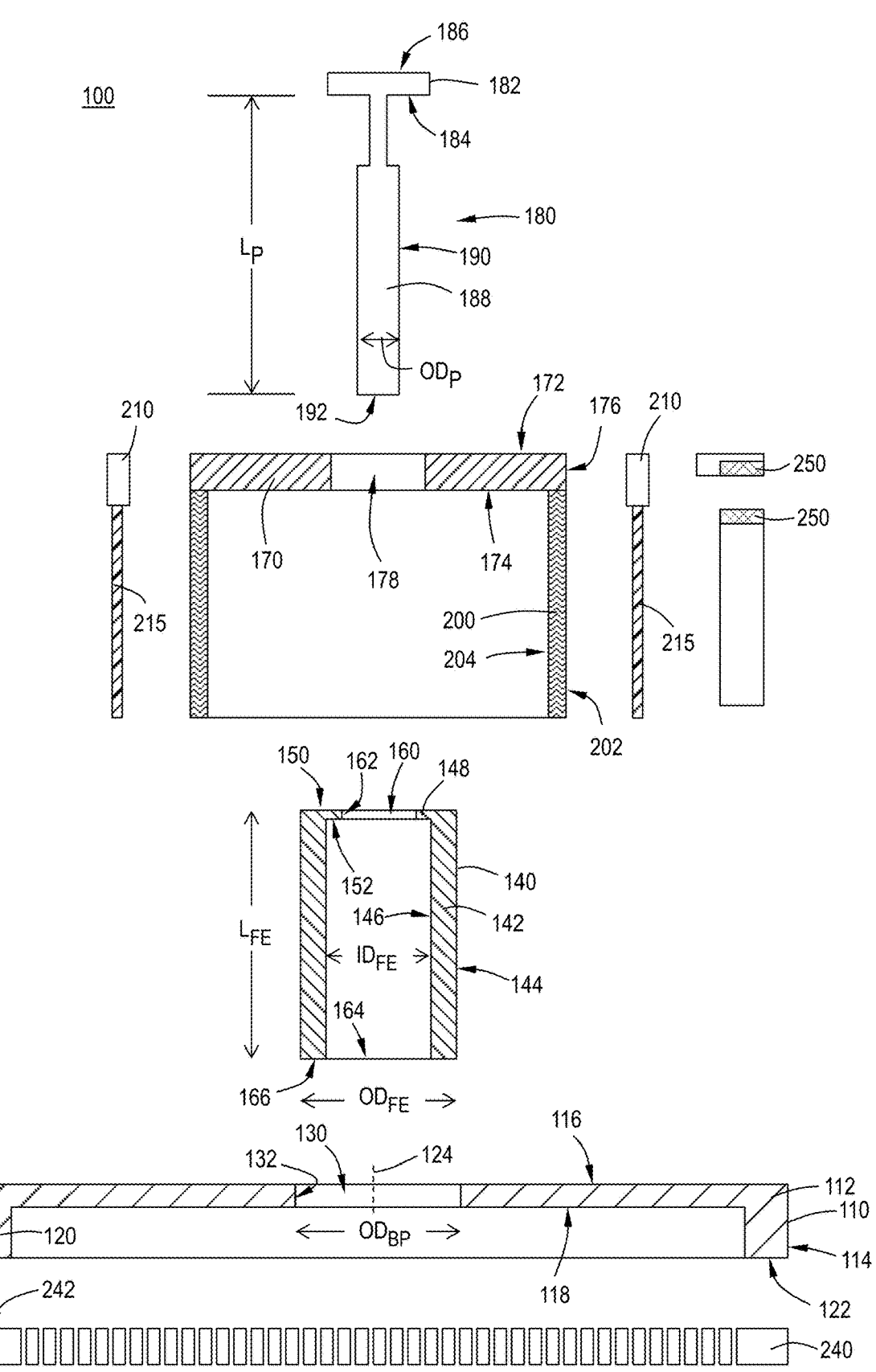
FIG. 2 illustrates an exploded schematic representation of the gas distribution assembly of FIG. 1.

Referring to FIGS. 1 and 2, one or more embodiments of the disclosure are directed to gas distribution assemblies 100. FIG. 1 shows a cross-sectional view of the gas distribution assembly 100 as an assembled component including a showerhead. FIG. 2 shows an exploded cross-sectional view of the gas distribution assembly for illustrative purposes.

The gas distribution assembly 100 comprises a backing plate 110. The backing plate 110 includes a body 112 with an outer peripheral face 114, a top surface 116 and a bottom surface 118. The outer peripheral face 114 of some embodiments, as illustrated, include an outer peripheral wall 120 with an outer peripheral wall thickness. The outer peripheral wall 120 has an outer peripheral wall bottom surface 122 that is further from the top surface 116 than the bottom surface 118. The bottom surface 118 is the face opposite the top surface 116 and defines a backing plate top thickness. The distance between the top surface 116 and the outer peripheral wall bottom surface 122 defines the overall thickness of the backing plate 110.

The backing plate 110 includes an opening 130 formed in a center 124 thereof. The opening 130 extends from the top surface 116 to the bottom surface 118 through the thickness of the backing plate. The opening 130 has an outer peripheral face 132 with an outer diameter $OD_{BP}$. The opening 130 in the backing plate 110 of some embodiments has an outer diameter $OD_{BP}$ in the range of 2 inches to 8 inches, or in the range of 3 inches to 6 inches.

The gas distribution assembly 100 includes a first enclosure 140. The first enclosure 140 is a generally cylindrical component that has an inner diameter $ID_{FE}$ and an outer diameter $OD_{FE}$ defining a thickness of the wall 142 of the first enclosure 140. The wall 142 of the first enclosure 140 has an outer face 144 and an inner face 146. The inner face 146 defines the inner diameter $ID_{FE}$ and the outer face 144 defines the outer diameter $OD_{FE}$.

The first enclosure 140 has a top 148 with a top surface 150 and a bottom surface 152 defining a thickness of the top 148. The top 148 of the first enclosure 140 has an opening 160 in the center thereof. The opening 160 has an outer diameter face 162 defining an outer diameter.

The first enclosure 140 has an open bottom 164 with a bottom face 166. The open bottom 164 is configured to allow a reactant or other gas flow to exit therethrough. The first enclosure 140 is configured to that a gas can flow through the opening 160 in the top 148 of the first enclosure into the inner portion bounded by the inner face 146 and then out the open bottom 164.

The first enclosure 140 has a length $L_{FE}$ measured from the top surface 150 of the top 148 of the first enclosure 140 to the bottom face 166 of the open bottom 164 of the first enclosure 140. The length $L_{FE}$ of the first enclosure 140 of some embodiments is in the range of 5 inches to 18 inches.

The outer diameter $OD_{FE}$ of the first enclosure 140 is smaller than the outer diameter $OD_{BP}$ in the center of the backing plate 110. There is a gap 158 between the outer diameter $OD_{FE}$ of the first enclosure 140 and the outer diameter $OD_{BP}$ of the opening 130 in the backing plate 110. In some embodiments, the outer diameter $OD_{FE}$ of the first enclosure 140 is in the range of 1 mm to 5 mm smaller than the outer diameter $OD_{BP}$ of the opening 130 in the center 124 of the backing plate 110.

A top plate 170 is connected to the top 148 of the first enclosure 140. The top plate 170 has a top surface 172 and a bottom surface 174 defining a thickness of the top plate 170. In some embodiments, the top plate 170 is integrally formed with the first enclosure 140 so that the top 148 of the first enclosure 140 and the top plate 170 are a single component. The top plate 170 has an opening 178 aligned with the opening 160 in the top 148 of the first enclosure 140.

In the illustrated embodiment, the top plate 170 is a disc-shaped component with an outer face 176. In some embodiments, the top plate 170 has a greater outer diameter than the outer diameter of the first enclosure 140 leaving a portion of the bottom surface 174 of the top plate 170 exposed.

Figure 3:
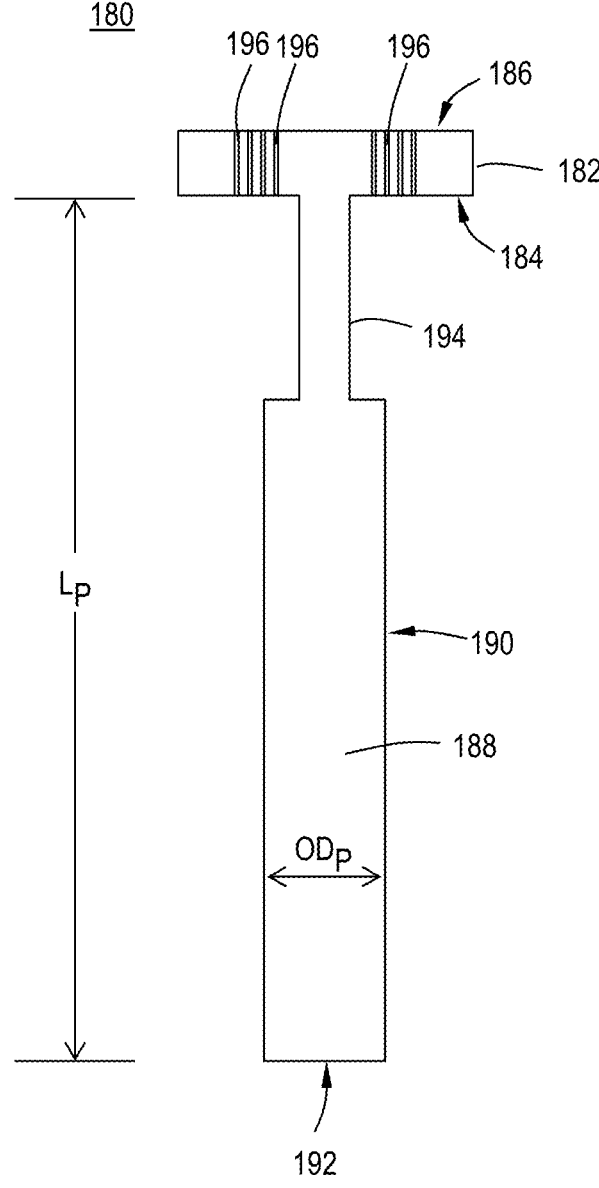
FIG. 3 illustrates a schematic representation of a plunger for use with a gas distribution assembly according to one or more embodiments of the disclosure.

With reference to FIGS. 1 through 3, the gas distribution assembly 100 includes a removable plunger 180 that is configured to extend through the opening 160 in the center of the first enclosure 140. FIG. 3 shows an expanded view of a plunger 180 in accordance with one or more embodiments of the disclosure. The plunger 180 illustrated is a round component with varying diameters along the length $L_P$ of the plunger 180. In the illustrated embodiment, the plunger 180 extends through the opening 178 in the top plate 170 and the opening 160 in the first enclosure and past the bottom face 166 of the open bottom 164 of the first enclosure 140.

The plunger 180 has a plunger top 182 with a plunger top bottom face 184 and a plunger top face 186. The plunger 180 has a plunger body 188 with an outer diameter face 190 defining an outer diameter $OD_P$ of the plunger 180. The plunger body 188 outer diameter $OD_P$ of some embodiments is in the range of 0.75 inches to 1.25 inches.

The plunger 180 is positioned so that the plunger top 182 bottom face 184 contacts the top surface 172 of the top plate 170 with the thickness of the top 182 of the plunger 180 above the top plate 170. The plunger 180 has a length $L_P$ extending from the plunger top 182 bottom face 184 to a plunger body 188 bottom face 192. The length $L_P$ of the plunger 180 is measured from the contact point of the plunger 180 with the top plate 170 and does not include the thickness of the top 182 of the plunger 180.

The plunger 180 illustrated in the figures has three sections: the top 182, the plunger body 188 and a plunger neck 194 connecting the plunger top 182 to the plunger body 188. The plunger top 182, plunger body 188 and plunger neck 194 of some embodiments are a single component with varying diameters. In some embodiments, the plunger top 182, plunger neck 194 and plunger body 188 are separate components connected together by any suitable connection known to the skilled artisan. The plunger neck 194 has a smaller outer diameter than the outer diameter $OD_P$ of the plunger body 188. The diameter of the plunger 180 is measured at the plunger body 188 and the plunger neck 194 outer diameter is not included in the measurement. The length of the plunger neck 194 is part of the overall length $L_P$ of the plunger 180.

The plunger top 182 comprises a plurality of apertures 196 to allow a flow of gas through the plunger top 182. When plunger 180 is positioned within the first enclosure 140, as shown in FIG. 1, the plurality of apertures 196 allow the flow of gas to pass through the plunger top 182 into the first enclosure 140.

The plunger 180 has a length $L_P$ sufficient to allow the bottom face 192 of the plunger body 188 to extend beyond the bottom face 166 of the open end 164 of the first enclosure 140 by a distance D. In some embodiments, the distance D is in the range of 1 mm to 5 mm, or in the range of 2 mm to 3 mm.

In use, the plunger body 188 outer diameter $OD_P$ is smaller than the inner diameter $ID_{FE}$ of the first enclosure 140, creating a gap G between the components. In some embodiments, the outer diameter $OD_P$ of the plunger body 188 is in the range of 1.5 inches to 2.5 inches smaller than the inner diameter $ID_{FE}$ of the first enclosure 140.

Referring again to FIGS. 1 and 2, the gas distribution assembly 100 of some embodiments comprises a compressible seal 200. The compressible seal 200 has an outer surface 202 and an inner surface 204 defining a thickness of the compressible seal 200. The compressible seal 200 connects the top plate 170 to the backing plate 110. The compressible seal 200 has a diameter sufficient to allow the compressible seal 200 to surround the opening 130 in the backing plate 110. The compressible seal allows movement of the top plate 170 relative to the backing plate 110 to prevent a gas from leaking from the inside of the first enclosure 140 to the outside of the compressible seal 200.

The compressible seal 200 can be any suitable component that can form a gas tight seal while allowing movement of the top plate 170 closer to and further from the backing plate 110. In some embodiments, the compressible seal comprises a bellows.

An actuator 210 is connected to the backing plate 110 and the top plate 170. The actuator 210 is configured to move the top plate 170 closer to and further from the backing plate 110. The actuator 210 can be any suitable component known to the skilled artisan. In some embodiments, the actuator 210 comprises one or more of a leadscrew or linear slide. In the illustrated embodiment, the actuator 210 comprises a stepper motor connected to the leadscrew.

In some embodiments, the actuator 210 is part of a second enclosure 215. In some embodiments, the second enclosure 215 is positioned around the first enclosure 140 and the compressible seal 200.

The actuator 210 of some embodiments is configured to move the top plate 170 closer to or further from the backing plate 110 by an amount sufficient to move the first enclosure into the plenum 230 formed between the backing plate 110 and a showerhead or faceplate 240. In some embodiments, the actuator 210 has a stroke in the range of 3 mm to 10 mm.

Some embodiments of the disclosure include a distance sensor 250 configured to measure a distance that the actuator has moved the top plate 170 relative to the backing plate 110. The distance sensor 250 can be any suitable component known to the skilled artisan that is capable of measuring distance. For example, suitable distance sensors may include, but are not limited to, ultrasonic sensors, laser sensors (LIDAR), infrared sensors and time-of-flight sensors.

In some embodiments, the gas distribution assembly 100 includes a controller 290. The controller 290 of some embodiments is connected to one or more of the actuator 210 or distance sensor 250. In some embodiments, the controller 290 is configured to control gas flow into the gas distribution assembly 100. In some embodiments, the control 290 has one or more of: a configuration to control the actuator 210; or a configuration to determine a measurement from a distance sensor 250 to determine a distance between the top plate 170 and the backing plate 110. In some embodiments, the controller 290 is configured to oscillate the top plate 170 relative to the backing plate 110.

The controller 290 may be one of any form of general-purpose computer processor, microcontroller, microprocessor, etc., that can be used in an industrial setting for controlling various chambers and sub-processors. The at least one controller 290 can have a processor, a memory coupled to the processor, input/output devices coupled to the processor, and support circuits to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 290 has one or more configurations to execute individual processes or sub-processes to perform the disclosed methods. The controller 290 can be connected to and configured to operate intermediate components to perform the functions of the methods. For example, the controller 290 can be connected to and configured to control one or more of gas valves, actuators, motors, slit valves, vacuum control, etc.

In some embodiments, the gas distribution assembly 100 further comprises a faceplate 240. In one or more embodiments, the faceplate 240 is attached to the backing plate 110. The faceplate 240 has a back surface 242 spaced a distance from a front surface 118 of the backing plate 110 to form a plenum 230. The actuator 210 and/or controller 290 of some embodiments is configured to prevent the bottom face 166 of the open end 164 of the first enclosure 140 from contacting the back face 242 of the faceplate 240.

Figure 4A:
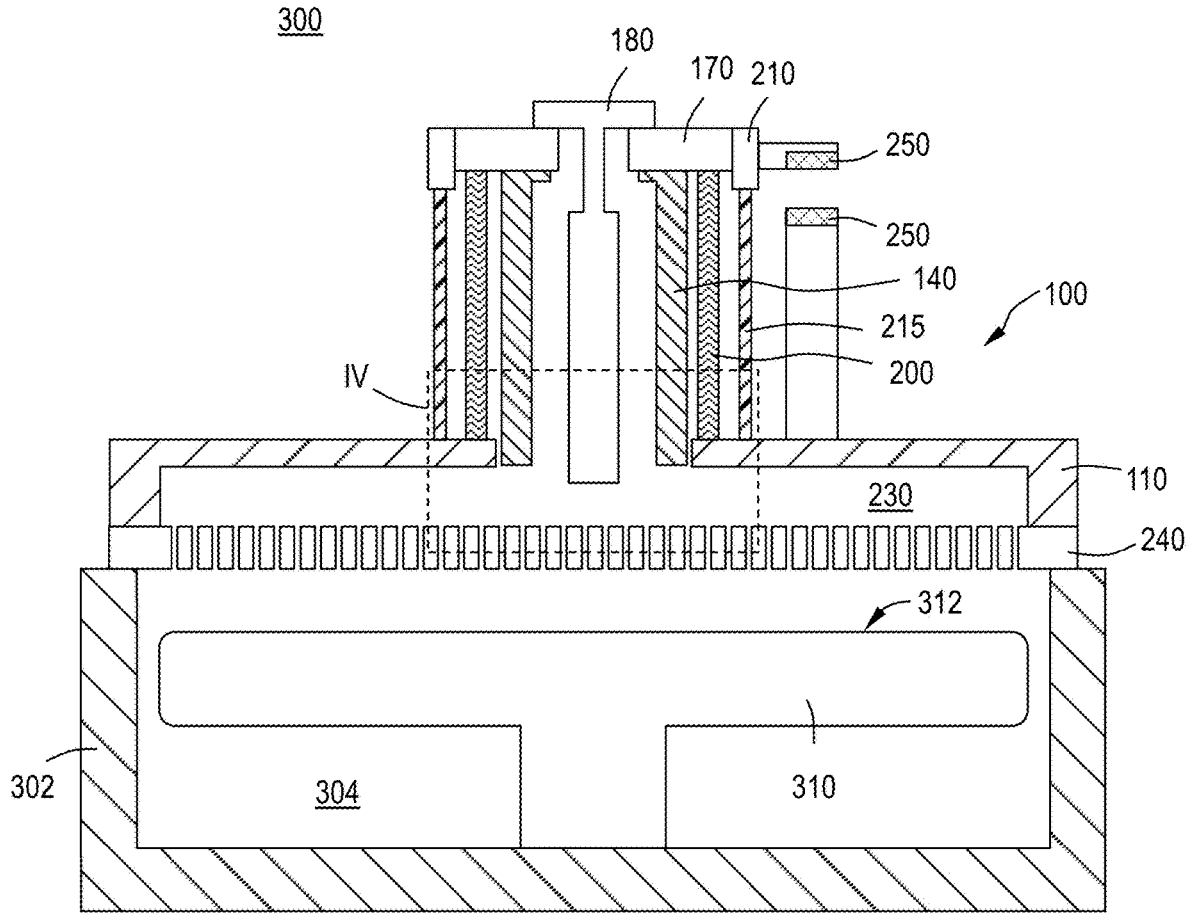
FIG. 4A shows a cross-sectional schematic view of a processing chamber 300 with the gas distribution assembly positioned in a first position according to one or more embodiments of the disclosure.

Referring to FIG. 4A, some embodiments of the disclosure are directed to processing chambers 300 comprising the gas distribution assembly 100 described herein including the faceplate 240. The processing chamber 300 includes a chamber body 302 with an interior 304. A substrate support 310 with a support surface 312 is positioned within the interior 304 of the chamber body 302.

Figure 5A:
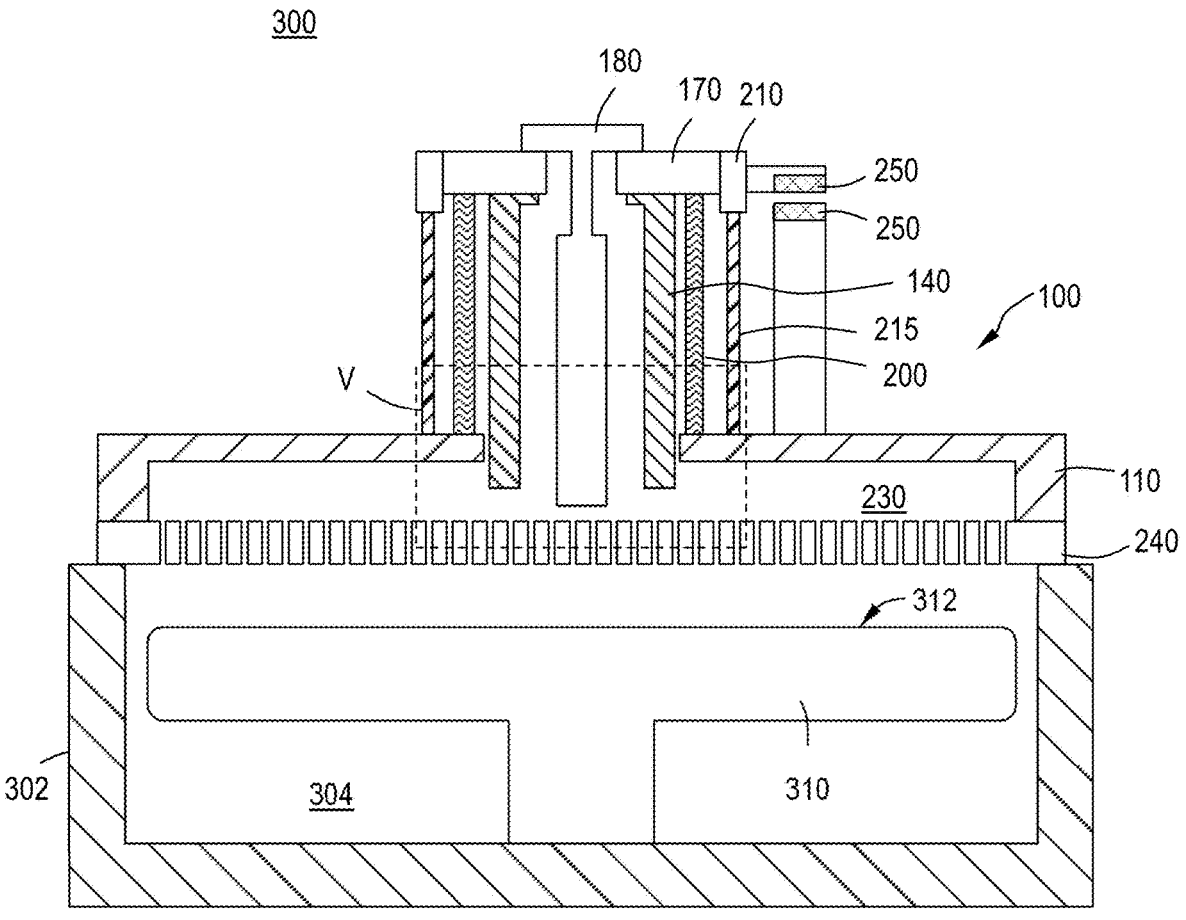
FIG. 5A shows a cross-sectional schematic view of a processing chamber 300 with the gas distribution assembly positioned in a second position according to one or more embodiments of the disclosure.
Figure 4B:
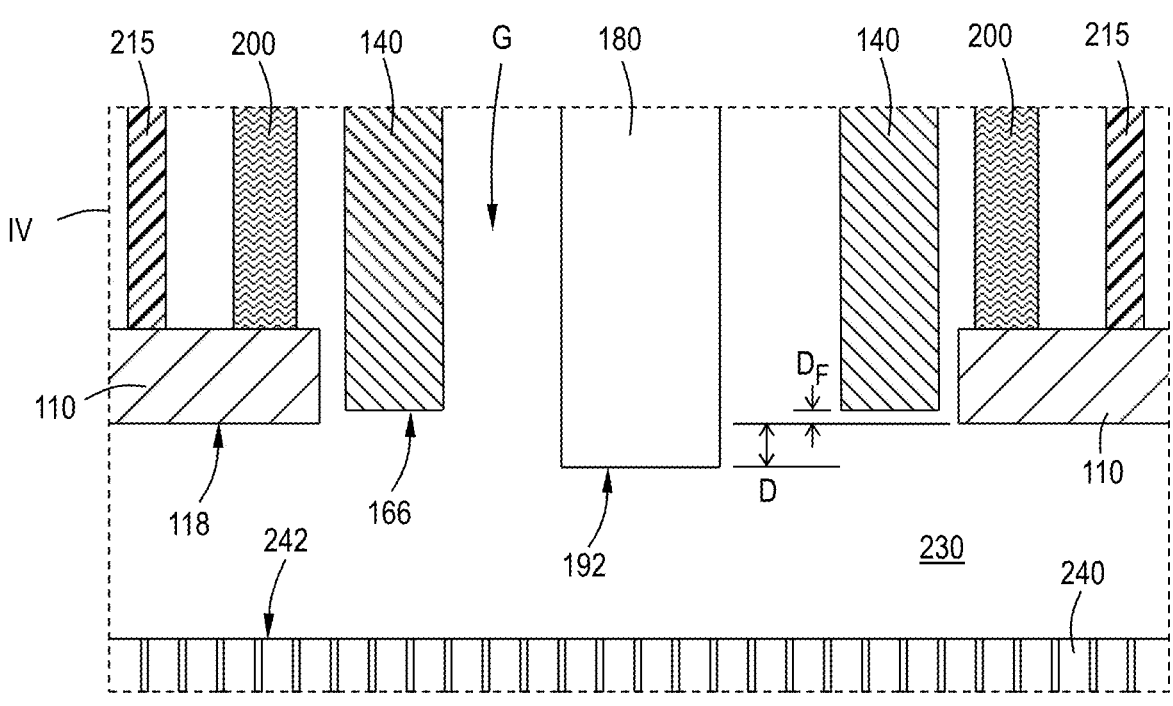
FIG. 4B shows an expanded view of region IV of FIG. 4A showing the gas distribution assembly positioned in the first position according to one or more embodiments of the disclosure.
Figure 5B:
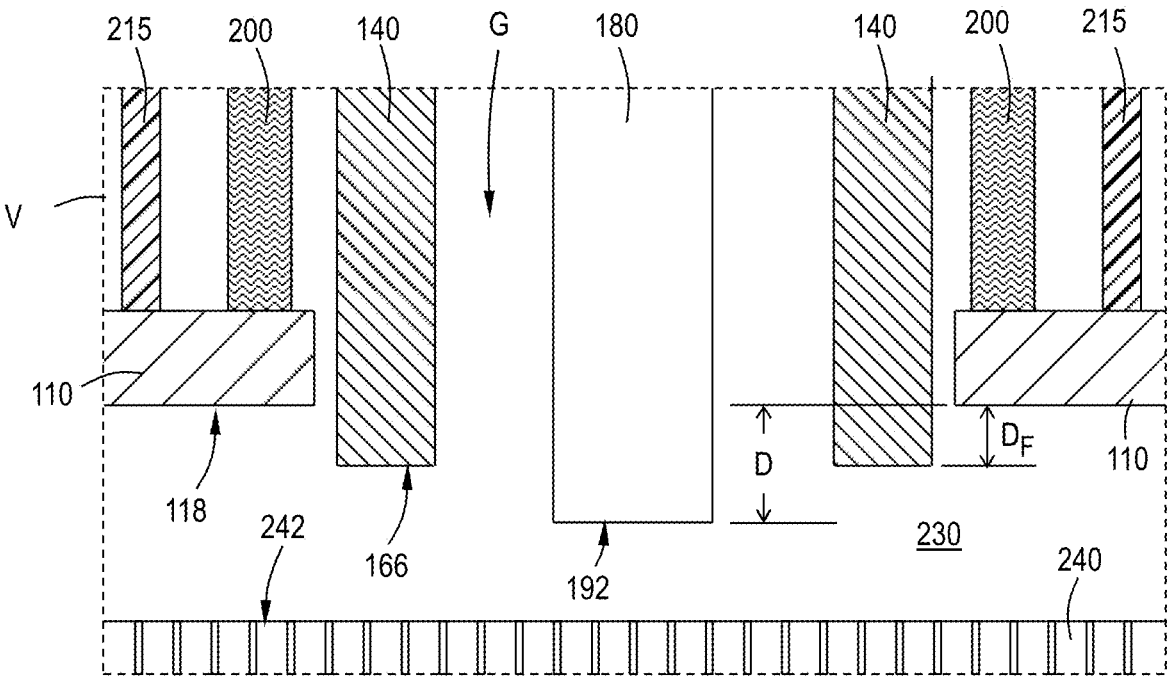
FIG. 5B shows an expanded view of region V of FIG. 5A showing the gas distribution assembly positioned in the second position according to one or more embodiments of the disclosure.
Figure 6:
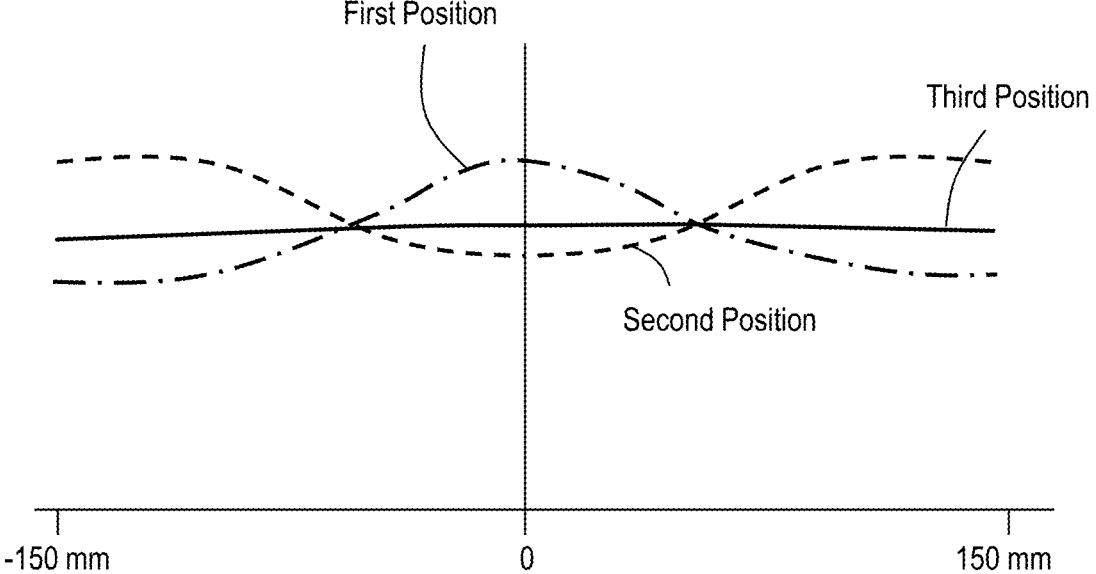
FIG. 6 shows a flow profile graph using the gas distribution assembly according to one or more embodiments of the disclosure.

Referring to FIGS. 4A through 6, one or more embodiments of the disclosure are directed to methods for controlling a flow profile in a gas distribution assembly 100. FIG. 4A shows a cross-sectional schematic view of a processing chamber 300 with the gas distribution assembly 100 positioned in a first position. FIG. 4B shows an expanded view of region IV of FIG. 4A showing the gas distribution assembly 100 positioned in the first position. FIG. 5A shows a cross-sectional schematic view of a processing chamber 300 with the gas distribution assembly 100 positioned in a second position. FIG. 5B shows an expanded view of region V of FIG. 5A showing the gas distribution assembly 100 positioned in the second position. FIG. 6 shows flow profiles for different positions of the first enclosure 140 and plunger 180 according to various embodiments of the disclosure for a 300 mm wafer. The skilled artisan will recognize that the embodiments of the disclosure are application to other dimensions of wafers including, but not limited to, 100 mm, 200 mm and 400 mm.

According to some methods of the disclosure, the flow profile in the gas distribution assembly 100 is controlled by moving a first enclosure 140 within an opening 130 in a backing plate 110 to extend a distance D into a plenum 230 formed between a bottom surface 118 of the backing plate 110 and a top surface 242 of a faceplate 240.

When in the first position, as shown in FIGS. 4A, 4B and 6, the bottom face 192 of the plunger is located a distance D below the bottom surface 118 of the backing plate 110. The bottom surface 166 of the open end 164 of the first enclosure 140 is located a distance DF above, in the illustrated case, the bottom surface 118 of the backing plate 110. The configuration illustrated in FIGS. 4A and 4B may generate a flow profile similar to the example profile shown in FIG. 6 labeled for the first position. As can be seen, the flow in the center of the wafer is greater than the flow at the outer boundary of the wafer.

When in the second position, as shown in FIGS. 5A, 5B and 6, the bottom face 192 of the plunger is located a distance D below the bottom surface 118 of the backing plate 110 that is greater than that shown in the first position. The bottom surface 166 of the open end 164 of the first enclosure 140 is located a distance DF below, in the case of the second position, the bottom surface 118 of the backing plate 110. The configuration illustrated in FIGS. 5A and 5B may generate a flow profile similar to the example profile shown in FIG. 6 labeled for the second position. As can be seen, the flow in the center of the wafer is lower than the flow at the outer boundary of the wafer.

In some embodiments, the position of the first enclosure 140 and plunger 180 relative to the back surface 118 of the backing plate 110 is changed using the actuator 210 and, optionally, the controller 290, to a different position so that the distance D and distance DF are changed to obtain a profile similar to the example profile in FIG. 6 labeled as the third position. Once the position of the first enclosure 140 and plunger 180 are tuned to provide a predetermined flow profile, the position can be locked in place or recorded for future use to maintain consistent flow profiles over time. In some embodiments, the flow profiles for different process gases are determined and the position of the first enclosure 140 and plunger 180 are changed to the predetermined location for each gas. The controller 290 of some embodiments, is configured to move the actuator 210 to a predetermined location for each process gas using the distance sensor 250 in a feedback circuit.

In some embodiments, the position of the first enclosure 140 and plunger 180 is oscillated around a predetermined value. For example, an initial position for the distance D and distance DF can be determined and then the actuator controlled to move the first enclosure 140 and plunger 180 to oscillate in a predetermined fashion around the initial position in either a symmetrical or asymmetrical manner.

Figure 7:
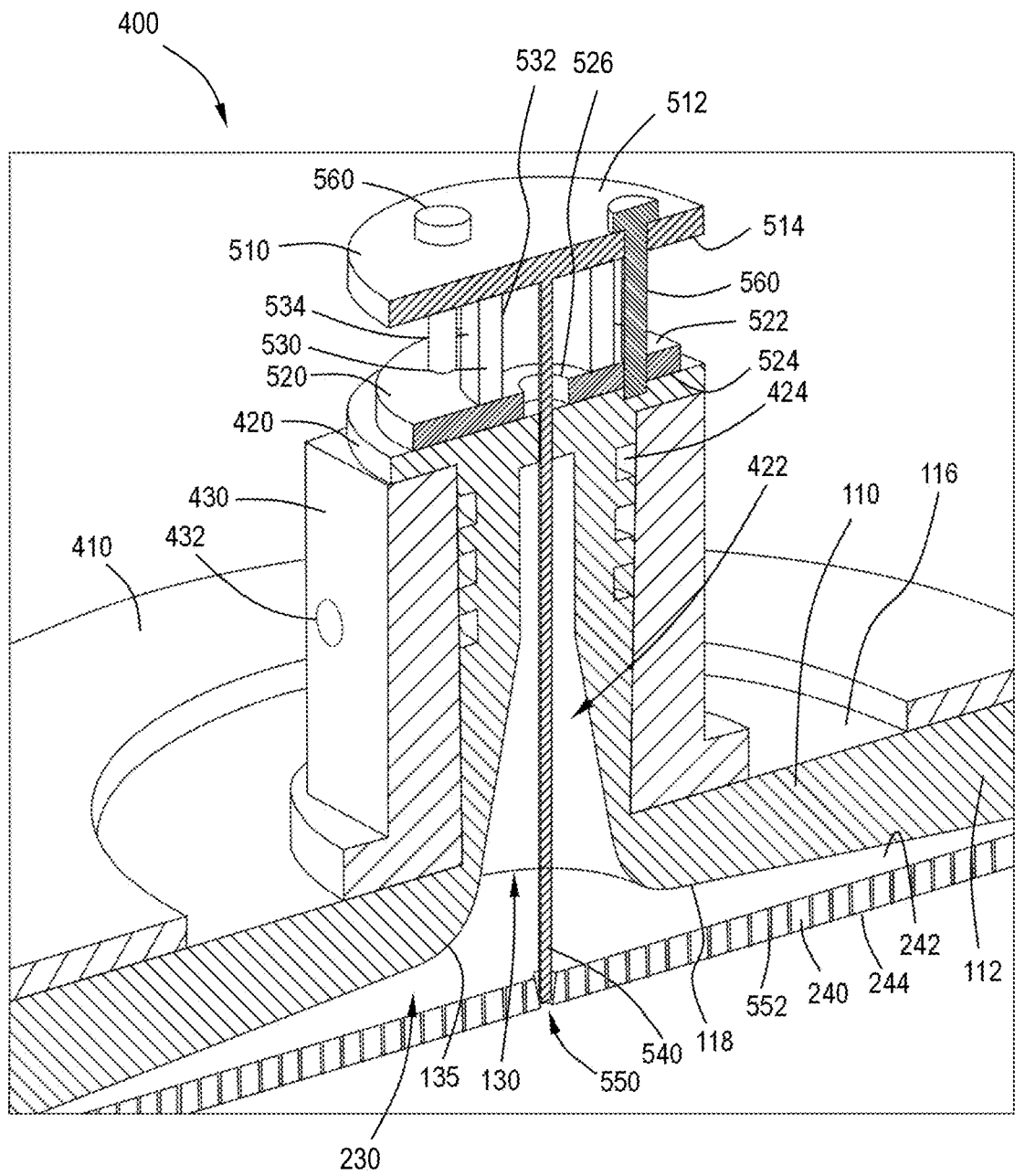
FIG. 7 shows a perspective view of a cross-section of a portion of a gas distribution assembly according to one or more embodiments of the disclosure.

FIG. 7 shows a cross-sectional view of the gas distribution assembly 400 according to one or more embodiments of the disclosure. The gas distribution assembly 400 comprises a backing plate 110 similar to that of FIG. 1. The backing plate 110 includes a body 112 with an outer peripheral face, a top surface 116 and a bottom surface 118.

The backing plate 110 includes an opening 130 formed in a center thereof. The opening 130 extends from the top surface 116 to the bottom surface 118 through the thickness of the backing plate 110. The opening 130 in the illustrated embodiment has a contoured surface 135 that extends outward along the bottom surface 118 to the outer peripheral edge of the backing plate 110 to create a funnel shape.

The gas distribution assembly 400 includes a faceplate 240 with a back surface 242 and a front surface 244. The faceplate 240 is positioned so that there is a distance between the back surface 242 of the faceplate 240 and the bottom surface 118 of the backing plate 110 to form a plenum 230. In the embodiment illustrated in FIG. 7, the plenum 230 has a decreasing depth from the center of the plenum 230 at center of the opening 130 in the backing plate 110 to the outer peripheral edge of the backing plate 110.

The gas distribution assembly 400 of some embodiments comprises a heater 410 positioned adjacent to the top surface 116 of the backing plate 110. The heater 410 can be any suitable heater known to the skilled artisan. For example, in some embodiments, the heater 410 comprises a thermal element (e.g., a resistive heater) that is connected to a suitable power source (not shown) to heat the backing plate 110.

A gas inlet 420 is positioned on the top surface 116 of the backing plate 110. The gas inlet 420 comprises an opening 422 in the interior of the gas inlet 420. The opening 422 is aligned with the opening 130 of the backing plate 110 to allow a flow of gas to pass from the gas inlet 420 into the plenum 230. The opening 422 of some embodiments is flared, as shown, to help create a vortex in the gas flow to allow the process gases to flow outward within the plenum 230 to the outer edges of the plenum.

A gas manifold 430 surrounds the gas inlet 420. The gas manifold 430 includes at least one manifold inlet 432 in fluid communication with the gas channels 424 formed between the gas inlet 420 and the gas manifold 430. The gas channels 424 are in fluid communication with the opening 422 in the gas inlet 420. In some embodiments, at least one opening (not shown) is formed in the top of the gas inlet 420 so that a flow of gas can be provided to the opening 422 in the direction substantially perpendicular to the faceplate 240 in addition to, or in place of, gases flowing into the opening 422 through the gas manifold 430.

The embodiment illustrated in FIGS. 7 through 10 show a gas flow tunability element that allows for the in-situ flow conductance to be controlled through the showerhead (e.g., faceplate 240). In general, chemical vapor deposition (CVD) and atomic layer deposition (ALD) processes exhibit flow sensitivity during processing. In most cases, the radial uniformity (center to edge or center profile) improvement requires showerhead design changes or significant recipe optimization. Embodiments of the disclosure provide apparatus and methods to control center thickness (or radial thickness) profile on the wafer using the in-situ flow conductance controllers.

The in-situ flow conductance controller 500 is part of the gas distribution assembly 400 of some embodiments. In some embodiments, the in-situ flow conductance controller 500 is a separate component, or assembly of components, that can be retro-fit into existing gas distribution assemblies. The in-situ flow conductance controller 500 comprises a top plate 510 and a bottom plate 520 connected together with walls 530 to form an interior 505 of the in-situ flow conductance controller 500.

The top plate 510 has a top surface 512 and a bottom surface 514 defining a thickness of the top plate 510. In some embodiments, the top plate 510 further comprises one or more openings 516 that allow a flow of gas to pass into the interior 505 through the top plate 510. For example, a purge gas line can be connected to the top plate 510 through any suitable connection known to the skilled artisan to allow a flow of purge gas to enter the interior 505 of the in-situ flow conductance controller 500 and be allowed to flow into the plenum 230. In some embodiments, an inert gas (e.g., argon) is flowed through the one or more openings 516 into the interior 505 of the in-situ flow conductance controller 500 to prevent back streaming of gases from the opening 422 in the gas inlet 420 through the opening 526 of the bottom plate 520.

The bottom plate 520 has a top surface 522 and a bottom surface 524 defining a thickness of the bottom plate 520. In some embodiments, as shown in the Figures, the bottom plate 520 comprises an opening 526 that passes through the bottom plate 520. Opening 526 of some embodiments is aligned with a center of the interior 505 of the in-situ flow conductance controller 500.

The walls 530 have an inner surface 532 and an outer surface 534. In the embodiment illustrated in FIG. 8, the walls 530 are a bellows that allows the interior 505 of the in-situ flow conductance controller 500 to be isolated from the external environment. The bellows can be any suitable flexible component made of any suitable material that can isolate the interior 505 from the external environment.

The in-situ flow conductance controller 500 includes a plunger 540 configured to extend through the opening 526 in the bottom plate 520. In some embodiments, the plunger 540 is integrally formed with the top plate 510 as a single component. In some embodiments, the plunger 540 is a separate component that is connected to the top plate 510 by any suitable connection known to the skilled artisan. For example, the plunger 540 and the top plate 510 include complementary screw threads and threaded holes to allow the plunger 540 to be removed and replaced.

The plunger 540 illustrated is a round component with a uniform diameter along the length $L_P$ of the plunger 540. The length of the plunger 540 is measured from the bottom surface 514 of the top plate 510. The length of the plunger 540 can be varied depending on, for example, the distance between the top plate 510 and the back surface 242 of the faceplate 240 extending through the gas inlet 420 and the backing plate 110.

The plunger 540 has a plunger body 542 with an outer diameter face 544 defining an outer diameter of the plunger 540. The plunger body 542 outer diameter can be any suitable diameter that can cooperatively interact with a center aperture 550 in the faceplate 240. In some embodiments, the plunger body 542 has a diameter in the range of 0.1 inches to 1.5 inches, or in the range of 0.25 inches to 1.25 inches, or in the range of 0.5 inches to 1 inch.

In some embodiments, the faceplate 240 comprises a center aperture 550. In some embodiments, the center aperture 550 has a diameter greater than the average diameter of the apertures 552 in the faceplate. In some embodiments, as shown in the Figures, the center aperture 550 has a variable diameter through the thickness of the faceplate 240. The opening of the center aperture 550 at the back surface 242 of the faceplate 240 is greater than the opening of the center aperture 550 at the front surface 244 of the faceplate 240. The opening of the center aperture 550 at the back surface 242 of the faceplate 240 has a greater diameter than the diameter of the plunger 540 at the distal end 546 of the plunger body 542.

In use, the plunger 540 is moved closer to the faceplate 240 to insert the distal end 546 of the plunger body 542 into the opening of the center aperture 550 at the back surface 242 of the faceplate 240. As the plunger 540 is moved closer to the front surface 244 of the faceplate 240 within the center aperture 550, the conductance of the gas flowing through the center aperture 550 causes the conductance at the center of the faceplate 240 to be choked-off, forcing more of the gas to flow toward the outer peripheral edge of the faceplate 240. Moving the distal end 546 of the plunger body 542 of the plunger 540 away from the front surface 244 of the faceplate 240 increases the conductance of gas flowing through the center aperture 550 of the faceplate 240 increasing the gas flow at the center of the faceplate 240.

Figures 8, 10A:
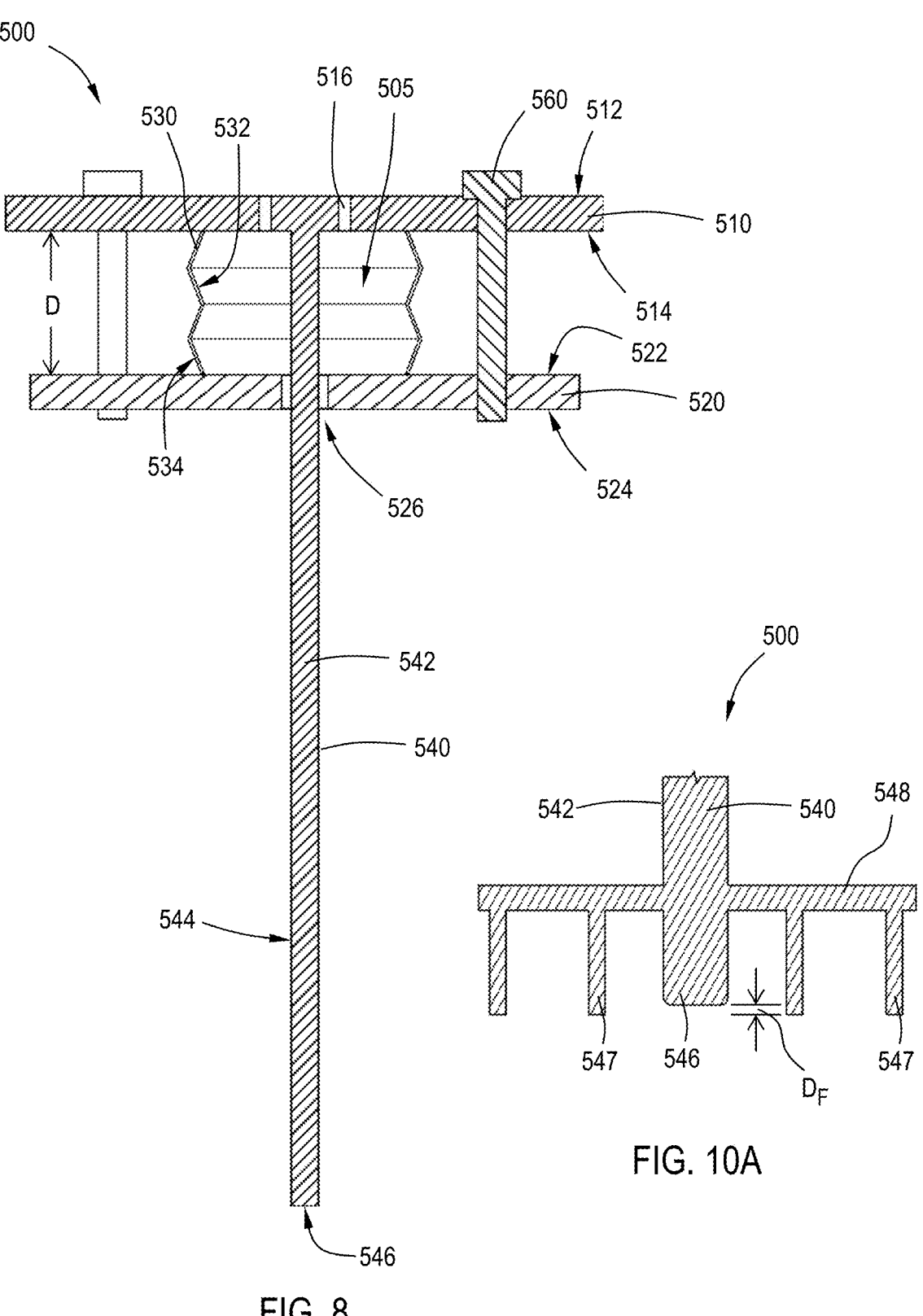
FIG. 8 shows a cross-sectional schematic view of an in-situ flow conductance controller in accordance with one or more embodiments of the disclosure.
FIG. 10A shows an expanded view of the end of a plunger of an in-situ flow conductance controller in accordance with one or more embodiments of the disclosure.
Figures 9, 10:
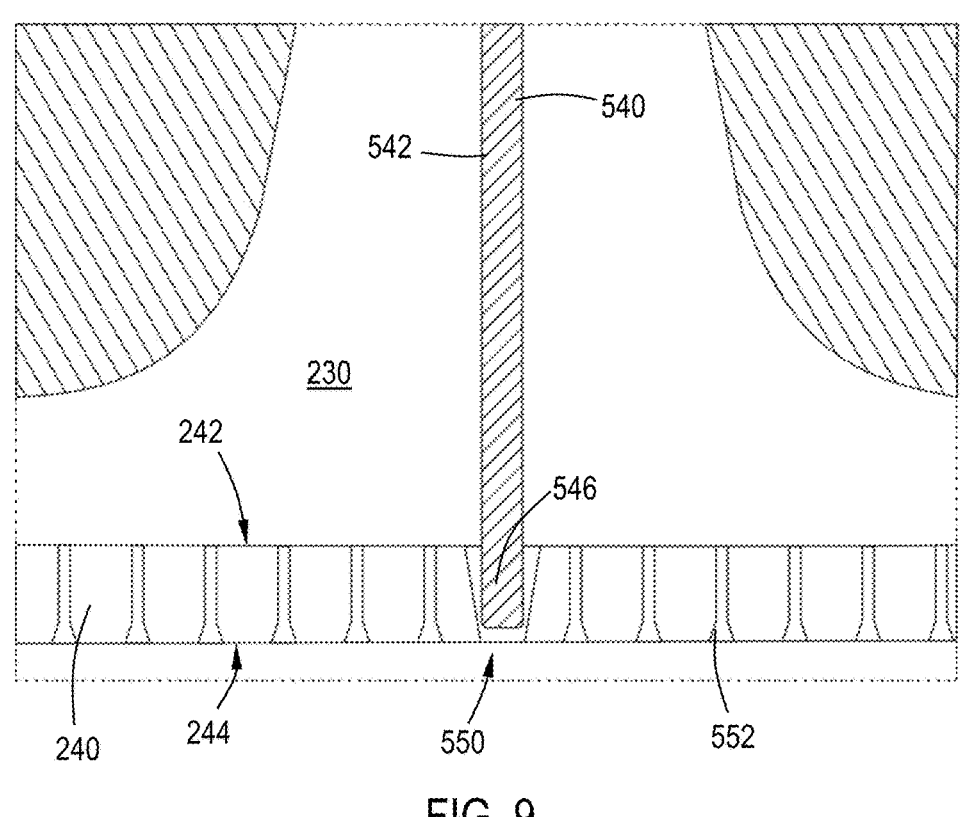
FIG. 9 shows an expanded view of a portion of a processing chamber gas distribution assembly according to one or more embodiments of the disclosure.
FIG. 10 shows an expanded view of a portion of a processing chamber gas distribution assembly according to one or more embodiments of the disclosure.

FIG. 9 illustrates an embodiment of the disclosure with a single ended plunger 540. As used in this manner, a "single ended" plunger has one distal end 546 or protrusion that interacts with an opening in the faceplate 240. FIGS. 10 and 10A illustrate an embodiment of the disclosure in which the plunger 540 has a distal end 546 and a plurality of fingers 547. FIG. 10A is an expanded view of the end of the plunger 540 that is configured to engage the apertures 552 of the faceplate 240. The fingers 547 so that the fingers 547 can be inserted into the apertures 552 in the faceplate 240 to further choke the gas flow. In some embodiments, a cross brace 548 is located adjacent to the distal end 546 of the plunger body 542. A plurality of fingers 547 are positioned on the cross brace 548 in such a manner that the fingers 547 can engage apertures 552 at the same time that the distal end 546 of the plunger body 542 engages the center aperture 550 of the faceplate 240.

In some embodiments, as shown in FIG. 10A, the fingers 547 extend further from the cross brace 548 than the distal end 546 of the plunger 540 by a distance DF. In some embodiments, the distance DF is in the range of 0.1 mm to 5 mm, or in the range of 0.2 mm to 2.5 mm, or in the range of 0.25 mm to 2 mm, or in the range of 0.5 mm to 1 mm. In some embodiments, the distal end 546 of the plunger 540 extends further from the cross brace 548 than the fingers 547 by a distance DF. In some embodiments, the distance DF is in the range of 0.1 mm to 5 mm, or in the range of 0.2 mm to 2.5 mm, or in the range of 0.25 mm to 2 mm, or in the range of 0.5 mm to 1 mm. In some embodiments, the distal end 546 of the plunger 540 extends substantially the same distance from the cross brace 548 than the fingers 547. As used in this manner, the term "substantially the same" means that the average distance that the fingers 547 extend from the cross brace 548 is less than 0.1 mm of the distance that the distal end 546 of the plunger 540 extends beyond the cross brace 548.

The plunger 540 acts as a linear actuating shaft inside the walls 530 of the in-situ flow conductance controller 500. A plurality of engagement elements 560 (e.g., screws or bolts) are positioned to connect the top plate 510 with the bottom plate 520. Actuation (e.g., rotation) of the engagement elements causes the top plate 510 to move closer to and/or further from the bottom plate 520, changing the length of the plunger 540 that extends through the opening 526 of the bottom plate 520 and changing the degree of engagement of the distal end 546 of the plunger 540 with the center aperture 550 of the faceplate 240. During movement of the top plate 510 relative to the bottom plate 520, the walls 530 flex or compress to maintain a fluid tight seal between the top plate 510 and the bottom plate 520. In some embodiments, there are three engagement elements 560. The lengths of the plurality of engagement elements 560 can be used to change the stroke of the plunger 540 to actuate within the showerhead holes.

Changing the degree of interaction between the distal end 546 of the plunger body 542 with the center aperture 550 of the faceplate 240 causes a change in the showerhead hole conductance at the center portion of the faceplate 240, allowing for control of the gas flow through the showerhead. Movement of the plunger 540 relative to the faceplate 240 can be performed manually or through an electronically controlled system (e.g., a stepper motor). The adjustment of the degree of engagement of the distal end 546 of the plunger 540 with the center aperture 550 of the faceplate 240 can be performed during calibration, or tool setup, or can be dynamically controlled during processing.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution assembly comprising:
a backing plate having an opening in a center thereof;
a faceplate attached to the backing plate and forming a plenum between the faceplate and the backing plate
a first enclosure having an inner diameter and outer diameter defining a wall thickness, a top having an opening in a center thereof and an open bottom with a bottom face configured to allow a reactant to exit therethrough, the outer diameter of the first enclosure being smaller than an outer diameter of the opening in the center of the backing plate, providing a gap between the outer diameter of the first enclosure and the outer diameter of the opening;
a top plate connected to the top of the first enclosure;
a compressible seal surrounding the first enclosure, the compressible seal extending between and connecting the top plate to the backing plate outside the opening in the backing plate and allowing movement of the top plate closer to and further from the backing plate, the compressible seal configured to prevent gas from leaking from inside the first enclosure to outside the compressible seal;
an actuator connected to the backing plate and the top plate, the actuator configured to move the top plate closer to and further from the backing plate; and
a plunger extending through the opening in the center of the first enclosure, the plunger having a plunger top with a plunger top bottom face and a plunger body having an outer diameter, the plunger having a length extending from a plunger top bottom face to a plunger body bottom face, and the plunger being movable and configured to change a center to edge pressure distribution above the faceplate.

2. The gas distribution assembly of claim 1, wherein the outer diameter of the first enclosure is in the range of 1 mm to 5 mm smaller than the outer diameter of the opening in the center of the backing plate.

3. The gas distribution assembly of claim 1, wherein the plunger has a length sufficient to allow the plunger body bottom face to extend beyond the bottom face of the first enclosure by a distance.

4. The gas distribution assembly of claim 3, wherein the distance is in the range of 2-3 mm.

5. The gas distribution assembly of claim 1, wherein the plunger top bottom face is in contact with the top face of the top plate.

6. The gas distribution assembly of claim 1, wherein the plunger top comprises a plurality of apertures to allow a flow of gas through the plunger top into the first enclosure.

7. The gas distribution assembly of claim 1, wherein the plunger body outer diameter is in the range of 1.5 inch to 2.5 inch smaller than the inner diameter of the first enclosure.

8. The gas distribution assembly of claim 1, wherein the plunger body outer diameter is in the range of 0.75 inches to 1.25 inches.

9. The gas distribution assembly of claim 1, wherein the actuator comprises one or more of a leadscrew or linear slide.

10. The gas distribution assembly of claim 1, wherein the actuator is part of a second enclosure positioned around the first enclosure and the compressible seal.

11. The gas distribution assembly of claim 1, wherein the actuator has a stroke in the range of 3 mm to 10 mm.

12. The gas distribution assembly of claim 1, wherein the compressible seal comprises a bellows.

13. The gas distribution assembly of claim 1, further comprising a distance sensor configured to measure a distance that the actuator has moved the top plate relative to the backing plate.

14. The gas distribution assembly of claim 1, further comprising a controller having one or more of a configuration to control the actuator, or a configuration to determine a measurement from a distance sensor to determine a distance between the top plate and the backing plate.

15. The gas distribution assembly of claim 1, further comprising a controller configured to oscillate the top plate relative to the backing plate.

16. The gas distribution assembly of claim 1, the faceplate having a back surface spaced a distance from a front surface of the backing plate to form the plenum, the actuator configured to prevent the bottom face of the first enclosure from contacting the back face of the faceplate.

17. A method of controlling a flow profile in the gas distribution assembly of claim 16, the method comprising moving the first enclosure within the opening in the backing plate to extend the distance into the plenum formed between the bottom surface of the backing plate and the top surface of a faceplate.

18. A gas distribution assembly comprising:

a backing plate having an opening in a center thereof, the backing plate having a front surface and a back surface;

a faceplate attached to the backing plate, the faceplate having a back surface spaced a distance from the front surface of the backing plate to form a plenum;

a first enclosure having an inner diameter and outer diameter defining a wall thickness, a top having an opening in a center thereof and an open bottom with a bottom face configured to allow a reactant to exit therethrough, the outer diameter of the first enclosure being in the range of 1 mm to 5 mm smaller than an outer diameter of the opening in the center of the backing plate, providing a gap between the outer diameter of the first enclosure and the outer diameter of the opening;

a top plate connected to the top of the first enclosure, the top plate having an opening aligned with the opening in the top of the first enclosure, the top plate having a top surface and a bottom surface;

a compressible seal surrounding the first enclosure, the compressible seal extending between and connecting the top plate to the backing plate outside the opening in the backing plate and allowing movement of the top plate closer to and further from the back surface of the backing plate, the compressible seal configured to prevent gas from leaking from inside the first enclosure to outside the compressible seal;

an actuator connected to the backing plate and the top plate, the actuator configured to move the top plate closer to and further from the back surface of the backing plate;

a plunger extending through the opening in the center of the first enclosure, the plunger having a plunger top with a plurality of apertures extending therethrough, the plunger top having a plunger top bottom face in contact with the top surface of the top plate, the plunger including a plunger body having an outer diameter, the plunger having a length extending from the plunger top bottom face to a plunger body bottom face, the length of the plunger sufficient to allow the plunger body bottom face to extend beyond the bottom face of the first enclosure by a distance in the range of 2-3 mm, and the plunger being movable and configured to change a center to edge pressure distribution above the faceplate; and a distance sensor configured to measure a distance between the top plate and the backing plate.

19. The gas distribution assembly of claim 18, wherein the plunger body outer diameter is in the range of 1.5 inch to 2.5 inch smaller than the inner diameter of the first enclosure.

20. The gas distribution assembly of claim 18, wherein the compressible seal comprises a bellows.

* * * * *